United States Patent
Kubo

(10) Patent No.: US 7,973,585 B2
(45) Date of Patent: Jul. 5, 2011

(54) DRIVER CIRCUIT

(75) Inventor: Satoru Kubo, Kanagawa (JP)

(73) Assignee: Renesas Electronics Corporation, Kawasaki-shi, Kanagawa (JP)

( * ) Notice: Subject to any disclaimer, the term of this patent is extended or adjusted under 35 U.S.C. 154(b) by 0 days.

(21) Appl. No.: 12/662,770

(22) Filed: May 3, 2010

(65) Prior Publication Data

US 2010/0308888 A1    Dec. 9, 2010

(30) Foreign Application Priority Data

Jun. 3, 2009    (JP) ................................ 2009-133941

(51) Int. Cl.
*H03L 5/00*    (2006.01)
(52) U.S. Cl. .......... 327/333; 327/309; 361/21; 361/91.1
(58) Field of Classification Search .................. None
See application file for complete search history.

(56) References Cited

U.S. PATENT DOCUMENTS

| | | | |
|---|---|---|---|
| 6,833,746 B2 * | 12/2004 | Drapkin et al. | 327/333 |
| 7,411,770 B2 * | 8/2008 | Logiudice et al. | 361/91.1 |
| 2001/0024137 A1 | 9/2001 | Miura | 327/333 |

FOREIGN PATENT DOCUMENTS

JP    2001-257579    9/2001

* cited by examiner

*Primary Examiner* — An T Luu
(74) *Attorney, Agent, or Firm* — McGinn IP Law Group, PLLC

(57) ABSTRACT

A driver circuit including a pre-driver B1 that operates by receiving operating power from a first power supply VDDI, and a main-driver B2 that receives operating power from a second power supply VDDE, amplifies an output signal from the pre-driver B1, and outputs the amplified signal. It also includes a first switch B4 between the first power supply VDDI and the pre-driver B1. It also includes a second switch B5 between the second power supply VDDE and the main-driver B2. A overvoltage protection sequence circuit B3 controls the On/Off states of the first switch B4 and the second switch B5 to controls the On/Off order of the pre-driver B1 and the main-driver B2. By doing so, the overvoltage protection sequence circuit B3 prevent an overvoltage from being applied to the driver circuit, especially to the main-driver B2.

11 Claims, 9 Drawing Sheets

DRIVER CIRCUIT

INCORPORATION BY REFERENCE

This application is based upon and claims the benefit of priority from Japanese patent application No. 2009-133941, filed on Jun. 3, 2009, the disclosure of which is incorporated herein in its entirety by reference.

BACKGROUND

1. Field of the Invention

The present invention relates to a driver circuit. The present invention relates to, for example, a Serializer/De-serializer (hereinafter referred to as "Serdes") macro, which is a high-speed interface macro to convert a low-speed parallel signal into a high-speed serial signal and output the converted high-speed serial signal, and/or to convert a high-speed serial signal into a low-speed parallel signal and output the converted low-speed parallel signal, and in particular to a driver circuit that outputs a serial signal.

2. Description of Related Art

In recent years, as the telecommunication technology has rapidly advanced, the data transmission speed has become increasingly faster. Since the Serdes macro belongs to the field of high-speed, large-capacity transmission technology, the demand for the increase in speed has especially grown. Further, for the high-speed data transmission, it has been desired to develop a technology for sending data having a large amplitude capable of withstanding attenuation caused by long-distance transmission, let alone short-distance transmission.

To realize a high-speed and large-amplitude operation, it is necessary to form a circuit by using transistors capable of operating at a high speed (low withstand voltage) and to connect the circuit to a high-voltage power supply. For example, up to the conventional speed of 3 Gbps, it is possible to realize such a circuit by forming the pre-driver by low-withstand-voltage (high-speed) transistors and connecting it to a low-voltage power supply, and forming the main-driver by high-withstand-voltage (low-speed) transistors and connecting it to a high-voltage power supply. However, to further increase the data transmission speed to at least twice the conventional speed, i.e., to 6 Gbps or faster, it is necessary to form the pre-driver by low-withstand-voltage (high-speed) transistors and connecting it to a low-voltage power supply, and form the main-driver by low-withstand-voltage (high-speed) transistors and connecting it to a high-voltage power supply.

FIG. 8 shows a circuit diagram of a conventional driver circuit disclosed in Japanese Unexamined Patent Application Publication No. 2001-257579 (Patent document 1). In a driver circuit shown in FIG. 8, a third resistor R300 is connected between the fourth power supply VDDE and the positive-phase output terminal 100, and a fourth resistor R400 is connected between the fourth power supply VDDE and the negative-phase output terminal 200. Further, this driver circuit 900 also includes an output stage 600 and a level shift circuit 700.

The output stage 600 includes a first N-channel MOS transistor N1, a second N-channel MOS transistor N2 and a third N-channel MOS transistor N3. The drain of the first N-channel MOS transistor N1 is connected to the positive-phase output terminal 100. The drain of the second N-channel MOS transistor N2 is connected to the negative-phase output terminal 200. The source of the third N-channel MOS transistor N3 is grounded and the gate is connected to the first power supply 300. Further, the drain of the third N-channel MOS transistor N3 is connected to the sources of the first and second N-channel MOS transistors N1 and N2.

The level shift circuit 700 includes a first resistor R100, a second resistor R200, a fourth N-channel MOS transistor N4, a fifth N-channel MOS transistor N5, and a sixth N-channel MOS transistor N6. A first resistor R100 is connected between the second power supply VDDI and the gate of the first N-channel MOS transistor N1. A second resistor R200 is connected between the second power supply VDDI and the gate of the second N-channel MOS transistor N2. The drain of the fourth N-channel MOS transistor N4 is connected to the gate of the first N-channel MOS transistor N1. The drain of the fifth N-channel MOS transistor N5 is connected to the gate of the second N-channel MOS transistor N2. The source of the sixth N-channel MOS transistor N6 is grounded and the gate is connected to the third power supply 310. Further, the drain of the sixth N-channel MOS transistor N6 is connected to the sources of the fourth and fifth N-channel MOS transistors N4 and N5. Further, the gate of the fourth N-channel MOS transistors N4 serves as a positive-phase input terminal 400, and the gate of the fifth N-channel MOS transistors N5 serves as a negative-phase input terminal 500.

Furthermore, the driver circuit 900 also includes a logic circuit 800, and the electrical power consumed in the internal region of the logic circuit 800 is supplied from the second power supply VDDI. This logic circuit 800 supplies input signals to the level shift circuit 700. Note that the driver circuit 900 includes an internal region composed of the logic circuit 800 and the level shift circuit 700, and an external region (output stage 600) in which signals to/from an external LSI circuit(s) is transmitted/received. Note also that the voltage of the power supply VDDI (second power supply) used in the internal region is lower than the voltage of the fourth power supply VDDE, i.e., the power supply used in the external region. Further, the gate oxide film of MOS transistors used in the external region is formed with a thickness larger than that of MOS transistors used in the internal region.

Furthermore, the driver circuit 900 has the differential output stage 600 that outputs a current externally and the resistance-load type differential circuit (level shift circuit 700) at the preceding stage, and this resistance-load type differential circuit (level shift circuit 700) performs conversion so that the signal level of the internal region becomes a higher potential and the amplitude becomes smaller, and outputs the converted signal to the differential output stage 600. As a result, the potential change becomes smaller in comparison to the case where a signal having a power-supply voltage amplitude is input to the differential output stage 600. In this way, the occurrence of potential fluctuations at the drain of the constant-current transistor N3 of the output stage 600 is prevented.

Next, the operation of the driver circuit 900 shown in FIG. 8 is explained hereinafter. In the driver circuit 900 having the configuration shown in FIG. 8, an input terminal 400 and an input terminal 500 are a positive-phase input terminal and a negative-phase input terminal respectively. Further, a logical High level of these input terminals is the same potential as the power supply voltage VDDI in the internal region, and a logical Low level is a ground potential. The transistors N3 and N6 are connected to other NMOS transistors in a current mirror connection, and their gate potentials are determined so that constant currents flow therethrough.

Then, when a High level and a Low level are input to the positive-phase input terminal 400 and the negative-phase input terminal 500 respectively, the transistor N4 is turned on and the transistor N5 is turned off. Therefore, the constant current I2 determined by the transistor N6 flows to the transistor N4, and the drain potential of the transistor N4 thereby becomes (VDDI31 I2×R1). Meanwhile, since no current flows to the transistor N5, the drain potential of the transistor N5 becomes VDDI. Therefore, the transistor N1 is turned off and the transistor N2 is turned on. Accordingly, since the constant current I1 determined by the transistor N3 flows to the transistor N2, the positive-phase output terminal 100 becomes the same potential as the fourth power supply VDDE and outputs a logical High level. Further, the negative-phase output terminal 200 becomes a potential expressed as (fourth power supply VDDE−I1×R4) and outputs a logical Low level.

SUMMARY

In Patent document 1, low-speed (high-withstand-voltage) transistors are used as the transistors constituting the output stage 600 so that they are not broken even if a high voltage is applied. However, it poses a problem that the demand for the high-speed operation cannot be satisfied. To realize a high-speed operation in the driver circuit shown in FIG. 8, the first and second N-channel transistors N1 and N2 constituting a part of the output stage 600 need to be constructed by using high-speed (low-withstand-voltage) N-channel transistors.

However, in general, high-withstand-voltage transistors are slow in operation, whereas low-withstand-voltage transistors are fast in operation. For transistors capable of operating fast, since the gate oxide film is formed with a small thickness in the CMOS process, the withstand voltage of the gate-source voltage Vgs, the gate-drain voltage Vgd, the gate-bulk voltage Vgb, and the drain-source voltage Vds is low. In particular, a voltage higher than the withstand-voltage tends to be applied to the gate-drain voltage Vgd, and thus often leading to the destruction of such transistors. For the transistors N1 and N2 in the output stage, there is a possibility that they could be destroyed when a voltage higher than the withstand voltage is applied in various occasions including at the time when the fourth power supply VDDE is powered on, at the time of the enable mode in which signals are output, at the time when the power supply is shut down, and at the time of power-down mode in which the operation is suspended without shutting down the power supply.

Therefore, the gate oxide film of MOS transistors that use the high voltage, i.e., fourth power supply VDDE needs to be formed with a thickness larger than the gate oxide film of MOS transistors that use the second power supply VDDI. Accordingly, the NMOS transistors of the output stage 600 cannot be replaced by low-withstand-voltage (high-speed) transistors having a thinner oxide film. Therefore, there is a problem that the driver circuit 900 of FIG. 8 cannot perform a high-speed operation.

FIG. 9 shows a timing chart of the conventional driver circuit of FIG. 8 under the assumption that the first and second N-channel MOS transistors N1 and N2 are constructed by using low-withstand-voltage (high-speed) N-channel transistors to realize a high-speed operation, and the problem of the related art is explained in detail with reference to the figure.

Note that in the following explanation, "H" and "L" represent potential levels of a signal or at a node, and represent a High level state and Low level state respectively. In the explanation, an On-state and Off-state represent operations of a switch or a transistor, and represent a conducting state and disconnected state respectively. Further, examples of the large amplitude and small amplitude include 1000 mVpp and 500 mVpp respectively. Examples of the high speed and low speed include 6 Gbps and 3 Gbps respectively. Examples of the low-voltage power supply and high-voltage power supply include 1.0 V and 1.8 V respectively.

Note that Patent document 1 does not disclose any concrete timing chart illustrating how the circuit operates depending on the On/Off state of the power supplies VDDE and VDDI and depending on the enable/power-down mode. Therefore, in the following explanation, a timing chart that is obtained by the inventors of the present application by performing a simulation based on the circuit disclosed in Patent document 1 is shown.

Note that in the configuration of Patent document 1, the switching between an enable mode and a power-down mode is implemented by changing the On-Off states of the fourth power supply VDDE, second power supply VDDI, third power supply 310, and first power supply 300.

<Section T1>

The pattern in the section T1 in FIG. 9 is explained. The fourth power supply VDDE is in an Off-state; the second power supply VDDI changes between On/Off states; and the third power supply 310 and the first power supply 300 are in an Off-state. Since the fourth power supply VDDE, which is a high-voltage power supply, is an Off-state, the transistors N1 and N2 are not destroyed.

<Section T2>

The pattern in the section T2 in FIG. 9 is explained. The fourth power supply VDDE is in an On-state, and the second power supply VDDI, the third power supply 310 and the first power supply 300 are in an Off-state. The outputs of the transistors N4 and N5, which is the output of the level shift circuit 700, are unsettled. Further, since the transistor N3, which is the constant current source of the output stage 600, is in an Off-state, the levels of the output terminals 100 and 200 rise to the fourth power supply VDDE immediately. Therefore, if the voltage of the fourth power supply VDDE is higher than the withstand voltage of the transistors N1 and N2, a voltage higher than the withstand voltage is applied between the gates and drains of the transistors N1 and N2 and their gate oxide films are destroyed.

Note that once the gate oxide film is destroyed, the transistor neither works properly nor amplifies the signal after the destruction. However, the following explanation is made with an assumption that the destruction has not occurred.

<Section T3>

The pattern in the section T3 in FIG. 9 is explained. The fourth power supply VDDE and the second power supply VDDI are in an On-state, and the third power supply 310 and the first power supply 300 are in an Off-state. The transistor N6, which is the constant current source of the level shift circuit 700, is in an Off-state, and the transistors N4 and N5, which are the output of the level shift circuit 700, output H-levels from their drains at the same time. The transistors N1 and N2 of the output stage 600 are turned on at the same time. The transistor N3, which is the constant current source of the output stage 600, is in an Off-state, and the levels of the output terminals 100 and 200 rise to the fourth power supply VDDE. Therefore, the transistors N1 and N2 are destroyed as in the case of the section T2.

<Section T4>

The pattern in the section T4 in FIG. 9 is explained. The fourth power supply VDDE, the second power supply VDDI and the third power supply 310 are in an On-state, and the first power supply 300 is in an Off-state. The transistor N6, which is the constant current source of the level shift circuit 700, is in an On-state, and the transistors N4 and N5, which are the output of the level shift circuit 700, output complementary differential signals from their drains. As a result, the transistors N1 and N2 of the output stage 600 are in mutually different states between On/Off states. The transistor N3, which is the constant current source of the output stage 600, is in an Off-state, and the levels of the output terminals 100 and 200 rise to the fourth power supply VDDE. Therefore, the transistors N1 and N2 are destroyed as in the case of the section T2.

<Section T5>

The pattern in the section T5 in FIG. 9 is explained. The fourth power supply VDDE, the second power supply VDDI, the third power supply 310 and the first power supply 300 are in an On-state. The transistor N3, which is the constant current source of the output stage 600, is in an On-state, and thereby amplifies complementary differential signals output from the level shift circuit 700 and outputs amplified signals to the output terminals 100 and 200. Note that the center voltage of the complementary differential signals from the output terminals 100 and 200 during the section in which signals are output is determined by the following formula.

{fourth power supply VDDE−(resistor R300 or R400× half of the drain current of transistor N3)}

Further, since the H-level voltage from the output terminals 100 and 200 is connected to a terminator on the receiving side, it does not rise to the fourth power supply VDDE. Therefore, the fourth power supply VDDE can be raised to some extent up to the voltage below which the transistors N1 and N2 are not destroyed by the H-level voltage from the output terminals 100 and 200.

So far, operations from a power-off state to a power-on state, and from a power-down mode to an enable mode are explained.

Next, operations from an enable mode to a power-down mode, and from a power-on state to a power-off state are explained hereinafter.

<Section T6>

The pattern in the section T2 in FIG. 9 is explained. The fourth power supply VDDE, the second power supply VDDI and the third power supply 310 are in an On-state, and the first power supply 300 is in an Off-state. Since the level shift circuit 700 outputs complementary differential signals, the transistors N1 and N2 of the output stage 600 in mutually different states between On/Off states. The transistor N3, which is the constant current source of the output stage 600, is in an Off-state, and the levels of the output terminals 100 and 200 rise to the fourth power supply VDDE. Therefore, the transistors N1 and N2 are destroyed as in the case of the section T2.

<Section T7>

The pattern in the section T7 in FIG. 9 is explained. The fourth power supply VDDE and the second power supply VDDI are in an On-state, and the third power supply 310 and the first power supply 300 are in an Off-state. The operation in this section is similar to that of the section T3.

<Section T8>

The pattern in the section T8 in FIG. 9 is explained. The fourth power supply VDDE is in an On-state, and the second power supply VDDI, the third power supply 310 and the first power supply 300 are in an Off-state. The operation in this section is similar to that of the section T2.

<Section T9>

The pattern in the section T9 in FIG. 9 is explained. The fourth power supply VDDE, the second power supply VDDI, the third power supply 310 and the first power supply 300 are in an Off-state. Since all the power supplies are in an Off-state, the transistors N1 and N2 are not destroyed.

As has been described so far, in the conventional configuration shown in FIG. 8, a voltage higher than the withstand-voltage is applied to the transistors N1 and N2 in the sections T2 to T4 and T6 to T8, and the gate oxide film is destroyed in these sections. Therefore, it is obvious that the driver circuit having the configuration like this cannot perform a high-speed, large-amplitude operation.

A first exemplary aspect of the present invention is a driver circuit including: a pre-driver that operates by receiving operating power from a first power supply; a main-driver that receives operating power from a second power supply, and amplifies an output signal from the pre-driver and outputs the amplified signal; a first switch provided between the first power supply and the pre-driver; a second switch provided between the second power supply and the main-driver; and an overvoltage protection sequence circuit that receives operating power from the first and second power supplies and performs On/Off control of the first and second switch.

In the configuration like this, since the first and second switch are provided, it is possible to prevent an overvoltage from being applied to the driver circuit by the On/Off control of the first and second switch. Further, by controlling the On/Off order of the first and second switch by using the overvoltage protection sequence circuit, the overvoltage is prevented from being applied to the driver circuit, in particular to the main-driver in any combination states of the On/Off states of the first and second power supplies and the enable mode/power-down modes. Therefore, the circuit can be protected from being destroyed by an overvoltage. Since the circuit is protected from an overvoltage in this way, it becomes possible to set the second power supply to a higher voltage and to form the main-driver by low-withstand-voltage (high-speed) transistors. As a result, the main-driver can be operated at a high speed with a large amplitude.

BRIEF DESCRIPTION OF THE DRAWINGS

The above and other exemplary aspects, advantages and features will be more apparent from the following description of certain exemplary embodiments taken in conjunction with the accompanying drawings, in which.

DETAILED DESCRIPTION OF THE EXEMPLARY EMBODIMENTS

Exemplary embodiments in accordance with the present invention are explained hereinafter with reference to the drawings.

First Exemplary Embodiment

Figure 1:
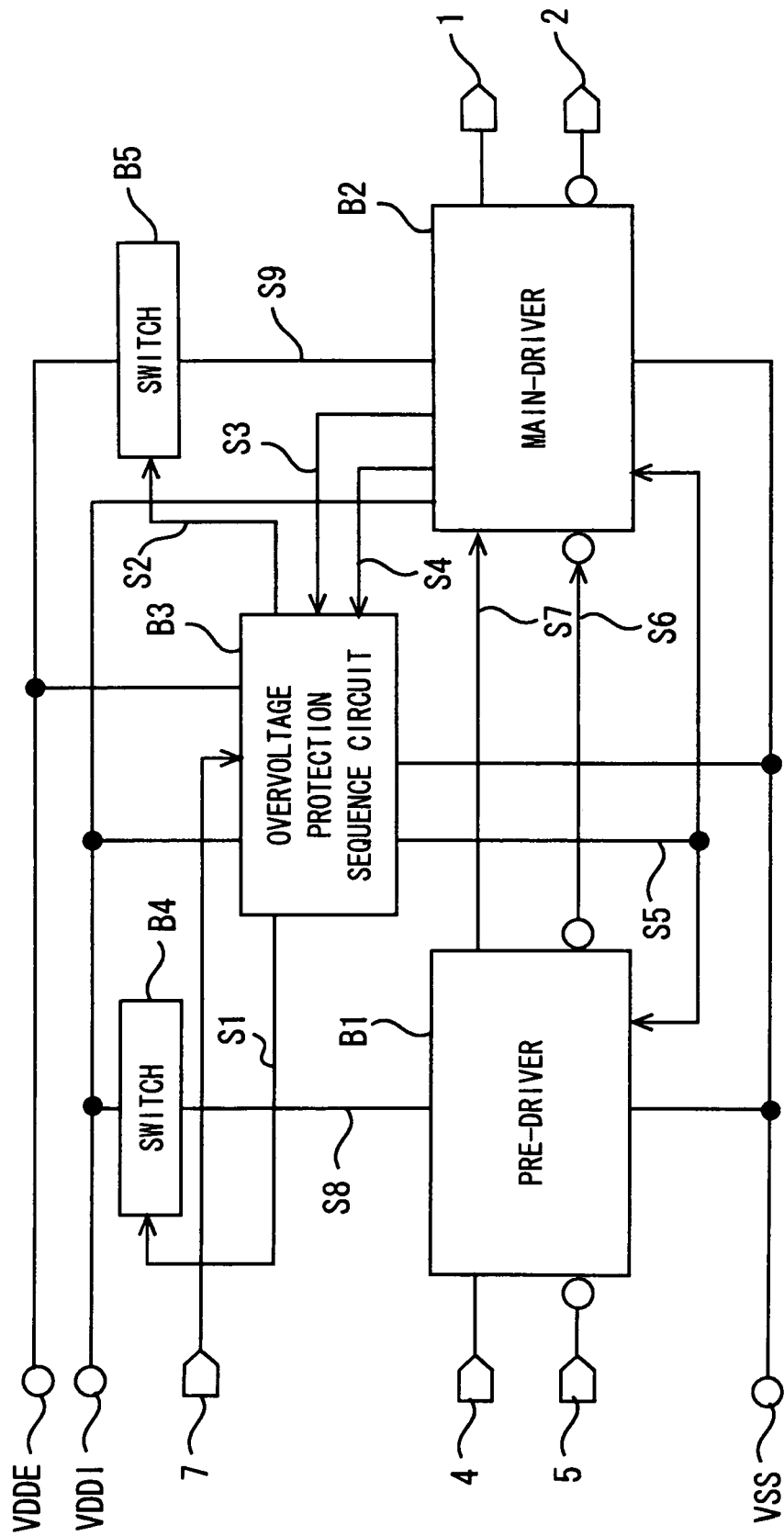
FIG. 1 is a functional block diagram of a first exemplary embodiment in accordance with a driver circuit of the present invention.
Figure 8:
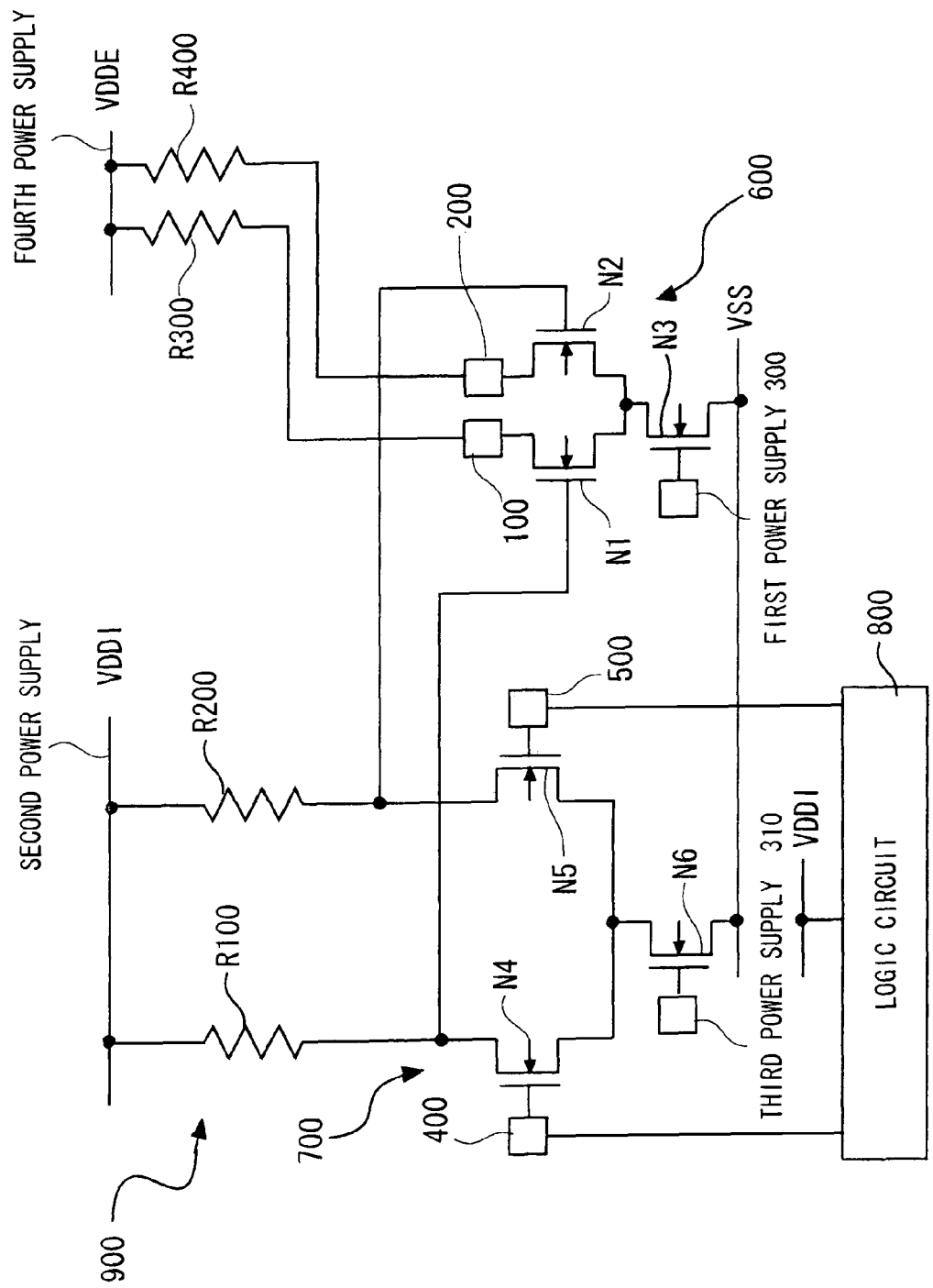
FIG. 8 is a circuit diagram of a conventional driver circuit disclosed in Japanese Unexamined Patent Application Publication No. 2001-257579 (Patent document 1)

FIG. 1 is a functional block diagram of a first exemplary embodiment in accordance with a driver circuit of the present invention. In this first exemplary embodiment, an overvoltage protection sequence circuit B3, a switch B4 and a switch B5 are added in the circuit shown in FIG. 8, which is explained as related art. Note that a pre-driver B1 and a main-driver B2 in FIG. 1 correspond to the level shift circuit and the output stage, respectively, of the related art shown in FIG. 8.

Assume that when the potential at the control input terminal 7 is a H-level, the driver circuit is in an enable mode, whereas when it is a L-level, the driver circuit is in a power-down mode.

The pre-driver B1 includes input terminals 4 and 5, and is connected to the main-driver B2 through nodes S6 and S7. A control signal supplied from the overvoltage protection sequence circuit B3 is input to the pre-driver B1 through a node S5. The power-supply terminal of the pre-driver B1 is connected to a switch B4 through a node S8, and then connected to a power supply VDDI through the switch B4. The ground terminal of the pre-driver B1 is connected to a GND power supply VSS. When a signal is input from a logic circuit (not shown) to the input terminals 4 and 5, the pre-driver B1 converts the signal so that the signal level becomes a high potential and the amplitude becomes smaller. That is, the pre-driver B1 functions as a level shift circuit.

The main-driver B2 is connected to the nodes S6 and S7, which are the output of the pre-driver B1. Further, the main-driver B2 includes output terminals 1 and 2. A control signal supplied from the overvoltage protection sequence circuit B3 is input to the main-driver B2 through the node S5. Further, a voltage used to monitor the operation of the main-driver B2 is input to the overvoltage protection sequence circuit B3 through nodes S3 and S4. The power-supply terminal of the main-driver B2 is connected to a switch B5 through a node S9, and then connected to a power supply VDDE through the switch B5. The ground terminal of the main-driver B2 is connected to the GND power supply VSS. The main-driver B2 converts a signal supplied from the pre-driver B1 into a signal having a large amplitude, and thereby sends data having a large amplitude capable of withstanding attenuation caused by long-distance transmission.

The overvoltage protection sequence circuit B3 is connected to a control input terminal 7. The overvoltage protection sequence circuit B3 is also connected to the switch B4 through a node S1, and then connected to the power supply VDDI through the switch B4. Further, the overvoltage protection sequence circuit B3 is connected to the switch B5 through a node S2, and then connected to the power supply VDDE through the switch B5. That is, the overvoltage protection sequence circuit B3 uses two types of power supplies, i.e., the second power supply VDDE and the first power supply VDDI. The ground terminal of the overvoltage protection sequence circuit B3 is connected to the GND power supply VSS.

The switch B4 is disposed between the pre-driver B1 and the first power supply VDDI. Further, a control signal supplied by the overvoltage protection sequence circuit B3 is input to the switch B4 through the node S1.

The switch B5 is disposed between the main-driver B2 and the second power supply VDDE. Further, a control signal supplied by the overvoltage protection sequence circuit B3 is input to the switch B5 through the node S2.

Figure 2:
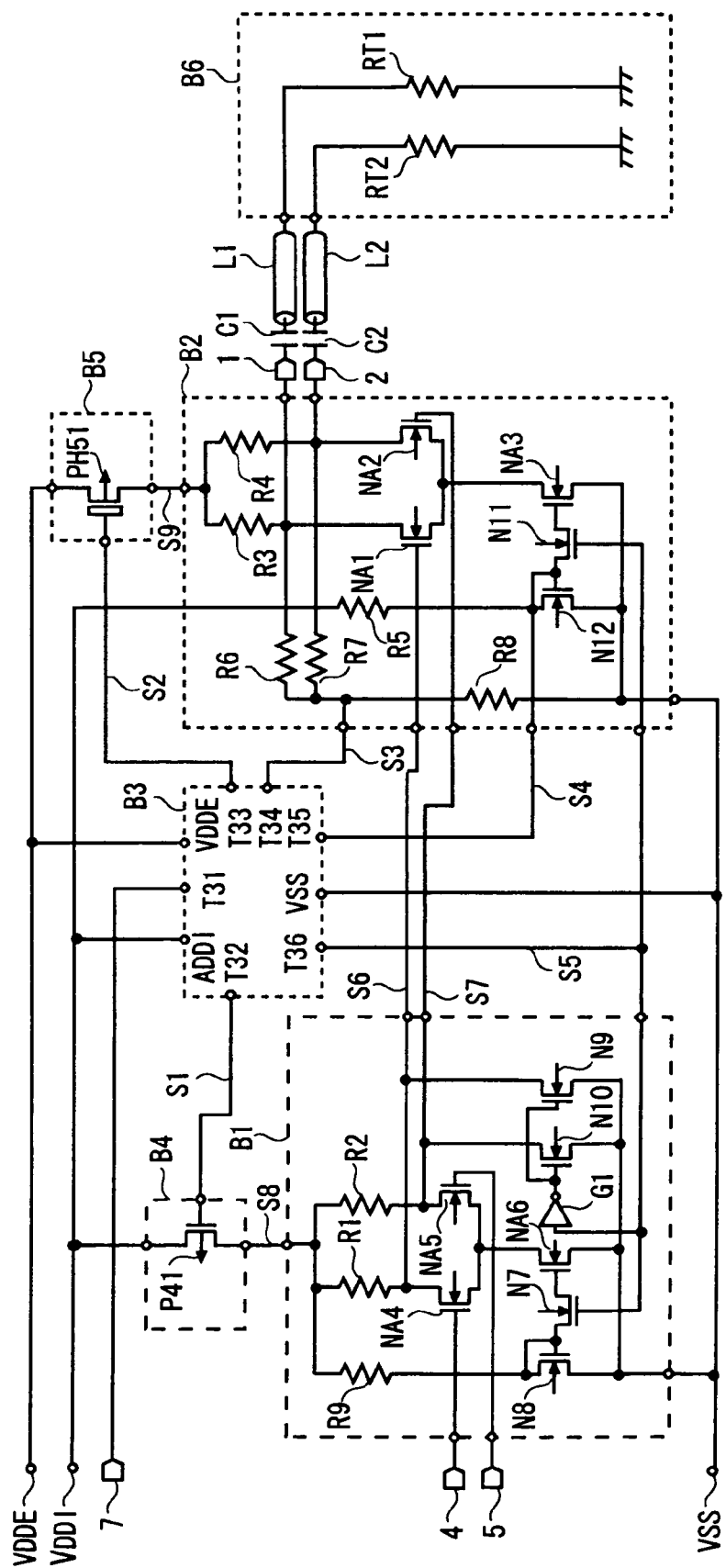
FIG. 2 is a circuit configuration diagram of a first exemplary embodiment.

FIG. 2 is a circuit configuration diagram of the first exemplary embodiment. In FIG. 2, the driver circuit includes a pre-driver B1, a main-driver B2, an overvoltage protection sequence circuit B3, a switch B4, a switch B5, a capacitance C1, a capacitance C2, signal transmission paths L1 and L2, and a terminator B6 to receive a signal.

A configuration of the pre-driver B1 is explained hereinafter. One terminal of each of resistors R1, R2 and R9 is connected to a node S8, which is an output of the switch B4. The other terminal of the resistor R9 is connected to the gate and drain of a low-withstand-voltage (high-speed) N-channel transistor N8 and to the drain of the low-withstand-voltage (high-speed) N-channel transistor N7. The source of the low-withstand-voltage (high-speed) N-channel transistor N8 is connected to the GND power supply VSS.

The other terminal of the resistor R1 is connected to the drain of a low-withstand-voltage (high-speed) N-channel transistor NA4, and to a node S6. The gate of the low-withstand-voltage (high-speed) N-channel transistor NA4 is connected to the input terminal 4. The other terminal of the resistor R2 is connected to the drain of a low-withstand-voltage (high-speed) N-channel transistor NA5, and to a node S7. The gate of the low-withstand-voltage (high-speed) N-channel transistor NA5 is connected to the input terminal 5.

The sources of the low-withstand-voltage (high-speed) N-channel transistor NA4 and the low-withstand-voltage (high-speed) N-channel transistor NA5 are connected to each other, and also connected to the drain of a low-withstand-voltage (high-speed) N-channel transistor NA6. The gate of the low-withstand-voltage (high-speed) N-channel transistor NA6 is connected to the source of a low-withstand-voltage (high-speed) N-channel transistor N7, and the source of the low-withstand-voltage (high-speed) N-channel transistor NA6 is connected to the GND power supply VSS. The gate of the low-withstand-voltage (high-speed) N-channel transistor N7 is connected to a node S5.

The node S6 is connected to the drain of a low-withstand-voltage (high-speed) N-channel transistor N9, and the source of the low-withstand-voltage (high-speed) N-channel transistor N9 is connected to the GND power supply VSS. The drain of a low-withstand-voltage (high-speed) N-channel transistor N10 is connected to the node S7, and the source of the low-withstand-voltage (high-speed) N-channel transistor N10 is connected to the GND power supply VSS. The gates of the low-withstand-voltage (high-speed) N-channel transistor N9 and the low-withstand-voltage (high-speed) N-channel transistor N10 are connected to a node S5 through a low-withstand-voltage (high-speed) logic circuit G1, which inverts the signal passing therethrough.

A configuration of the main-driver B2 is explained hereinafter. One terminal of each of resistors R3 and R4 is connected to a node S9, which is the output of the switch B5. One terminal of a resistor R5 is connected to the first power supply VDDI. The other terminal of the resistor R5 is connected to a node S4, the gate and drain of a low-withstand-voltage (high-speed) N-channel transistor N12, and the drain of a low-withstand-voltage (high-speed) N-channel transistor N11. The source of the low-withstand-voltage (high-speed) N-channel transistor N12 is connected to the GND power supply VSS.

The other terminal of the resistor R3 is connected to one terminal of a resistor R6, the drain of a low-withstand-voltage (high-speed) N-channel transistor NA1, and an output terminal 1. The gate of the low-withstand-voltage (high-speed) N-channel transistor NA1 is connected to the node S6.

The other terminal of the resistor R4 is connected to one terminal of a resistor R7, the drain of a low-withstand-voltage (high-speed) N-channel transistor NA2, and an output terminal 2. The gate of the low-withstand-voltage (high-speed) N-channel transistor NA2 is connected to the node S7.

The sources of the low-withstand-voltage (high-speed) N-channel transistor NA1 and the low-withstand-voltage (high-speed) N-channel transistor NA2 are connected to each other, and also connected to the drain of a low-withstand-voltage (high-speed) N-channel transistor NA3. The gate of the low-withstand-voltage (high-speed) N-channel transistor NA3 is connected to the source of a low-withstand-voltage (high-speed) N-channel transistor N11, and the source of the low-withstand-voltage (high-speed) N-channel transistor NA3 is connected to the GND power supply VSS. The gate of the low-withstand-voltage (high-speed) N-channel transistor N11 is connected to the node S5. The other terminal of each of the resistors R6 and R7 is connected to one terminal of a resistor R8 and a node S3. The other terminal of the resistor R8 is connected to the GND power supply VSS.

The switch B4 is composed of a low-withstand-voltage (high-speed) P-channel transistor P41. The source of the low-withstand-voltage (high-speed) P-channel transistor P41 is connected to the first power supply VDDI, and the gate and drain are connected to nodes S1 and S8 respectively.

The switch B5 is composed of a high-withstand-voltage (low-speed) P-channel transistor PH51. The source of the high-withstand-voltage (low-speed) P-channel transistor PH51 is connected to a second power supply VDDE, and the gate and drain are connected to nodes S2 and S9 respectively.

Figure 3:
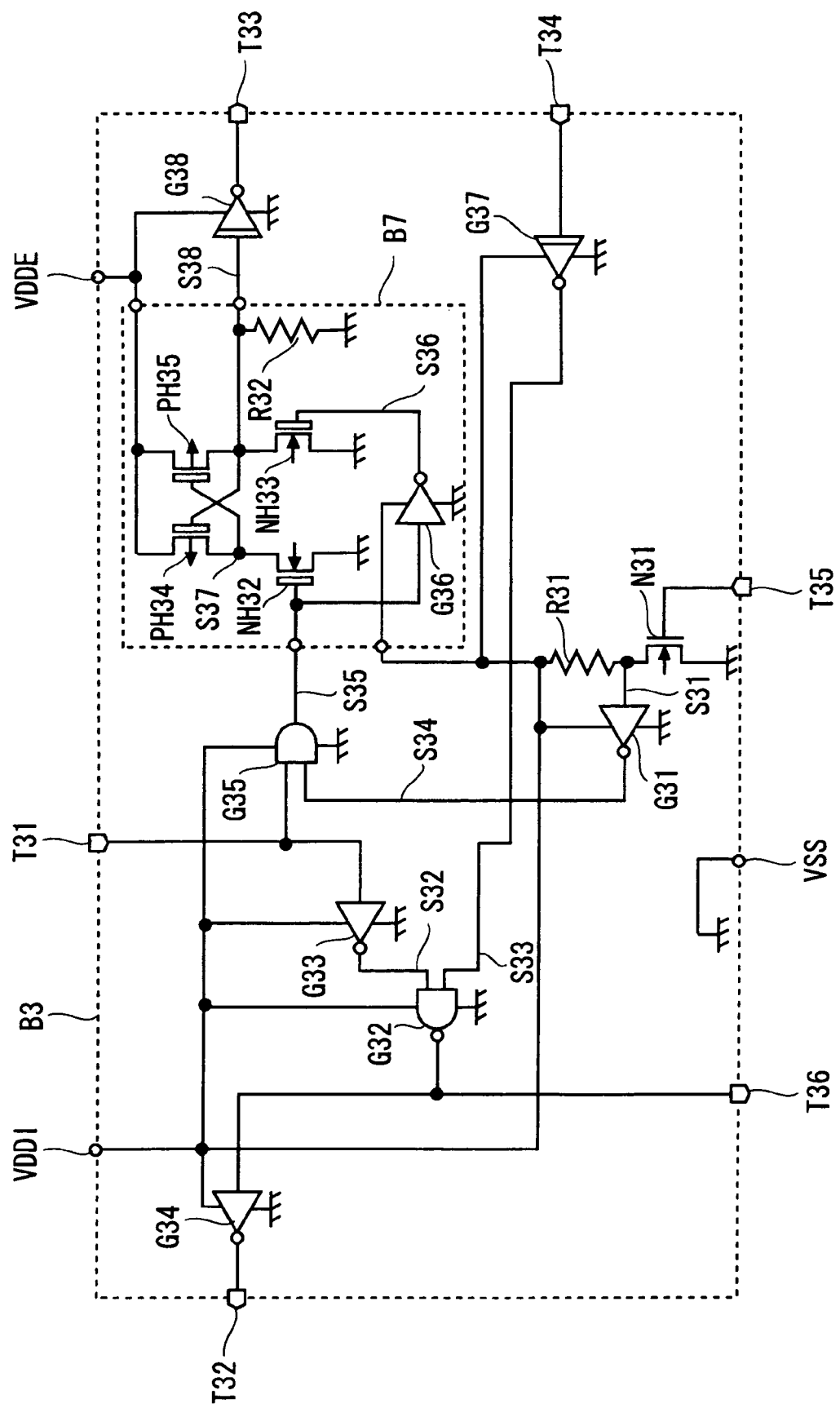
FIG. 3 is a circuit diagram of an overvoltage protection sequence circuit.

FIG. 3 is a circuit diagram of an overvoltage protection sequence circuit. The overvoltage protection sequence circuit B3 is explained hereinafter. One terminal of a resistor R31 is connected to the first power supply VDDI, and the other terminal is connected to the drain of a low-withstand-voltage (high-speed) N-channel transistor N31 and the input of a low-withstand-voltage (high-speed) logic circuit G31. The gate of the low-withstand-voltage (high-speed) N-channel transistor N31 is connected to an input terminal T35 of the overvoltage protection sequence circuit B3, and the source of the low-withstand-voltage (high-speed) N-channel transistor N31 is connected to the GND power supply VSS.

A low-withstand-voltage (high-speed) logic circuit G32 uses an input signal input to a node S32 as one of its input signals, and an input signal input to a node S33 as the other input signal. A low-withstand-voltage (high-speed) logic circuit G35 uses an input signal input to an input terminal T31 of the overvoltage protection sequence circuit B3 as one of its input signals, and an input signal input to a node S34 as the other input signal. The output of the low-withstand-voltage (high-speed) logic circuit G31 is connected to a node S34. One input terminal of the low-withstand-voltage (high-speed) logic circuit G35 is connected to the input terminal T31 of the overvoltage protection sequence circuit B3, and the other input terminal is connected to the node S34. Further, its output terminal is connected to the node S35.

The sources of high-withstand-voltage (low-speed) P-channel transistors PH34 and PH35 are connected to the second power supply VDDE. The gates of the high-withstand-voltage (low-speed) P-channel transistors PH34 and PH35 are connected to the drains of the other one of the transistors PH34 and PH35. The drain of the high-withstand-voltage (low-speed) P-channel transistor PH34 is connected to a node S37, which is connected to the drain of a high-withstand-voltage (low-speed) N-channel transistor NH32.

The drain of the high-withstand-voltage (low-speed) P-channel transistor PH35 is connected to a node S38, which is connected to the drain of a high-withstand-voltage (low-speed) N-channel transistor NH33.

The gate of the high-withstand-voltage (low-speed) N-channel transistor NH32 is connected to a node S35. The gate of the high-withstand-voltage (low-speed) N-channel transistor NH33 is connected to a node S35 through a low-withstand-voltage (high-speed) logic circuit G36, which inverts the signal passing therethrough. The sources of high-withstand-voltage (low-speed) N-channel transistors NH32 and NH33 are connected to the GND power supply VSS. One terminal of a resistor R32 is connected to a node S38, and the other terminal is connected to GND power supply VSS.

The input of a high-withstand-voltage (low-speed) logic circuit G38 is connected to a node S38, and the output is connected to an output terminal T33 of the overvoltage protection sequence circuit B3. The input of a high-withstand-voltage (low-speed) logic circuit G37 is connected to an input terminal T34 of the overvoltage protection sequence circuit B3, and the output is connected to a node S33.

A node S32, which is one of the inputs of the low-withstand-voltage (high-speed) logic circuit G32, is connected to an input terminal T31 of the overvoltage protection sequence circuit B3 through a low-withstand-voltage (high-speed) logic circuit G33, which inverts the signal passing therethrough. The other input of the low-withstand-voltage (high-speed) logic circuit G32 is connected to a node S33. The output of the low-withstand-voltage (high-speed) logic circuit G32 is connected to an output terminal T36 of the overvoltage protection sequence circuit B3.

The input of the high-withstand-voltage (low-speed) logic circuit G34 is connected to an output terminal T36 of the overvoltage protection sequence circuit B3, and the output is connected to an output terminal T32 of the overvoltage protection sequence circuit B3.

The power-supply terminals of the low-withstand-voltage (high-speed) logic circuits G31 to G36 and the high-withstand-voltage (low-speed) logic circuit G37 are connected to the first power supply VDDI. The power-supply terminal of the high-withstand-voltage (low-speed) logic circuit G38 is connected to the second power supply VDDE and the ground terminal is connected to the GND power supply VSS.

Note that the high-withstand-voltage (low-speed) P-channel transistors PH34 and PH35, the high-withstand-voltage (low-speed) N-channel transistors NH32 and NH33, the low-withstand-voltage (high-speed) logic circuit G36, and the resistor R32 constitute a level shift circuit B7.

The level shift circuit B7 receives an input signal from the node S35 and outputs the signal to the node S38. In this way, a CMOS logic control signal using the first power supply VDDI is converted into a CMOS logic control signal using the second power supply VDDE.

Output terminals 1 and 2 of the main-driver B2 are connected to one terminals of capacitances C1 and C2 respectively. The other terminals of the capacitances C1 and C2 are connected to one ends of signal transmission paths L1 and L2 respectively. The other terminals of the signal transmission paths L1 and L2 are connected to a terminator B6, in which the other terminals of the signal transmission paths L1 and L2 are connected to the GND power supply VSS of the terminator B6 through resistors RT1 and RT2 respectively.

Note that the value of the resistors RT1 and RT2 is preferably 50Ω, which is commonly used to terminate a high-speed signal.

An operation of the first exemplary embodiment having the configuration like this is explained hereinafter with reference to a timing chart shown in FIG. 4. In the following explanation, "H" and "L" represent potential levels of a signal or at a node, and represent a High level state and Low level state respectively. Further, an On-state and Off-state represent operations of a switch or a transistor, and represent a conducting state and cut-off state respectively in the following explanation.

Figure 4:
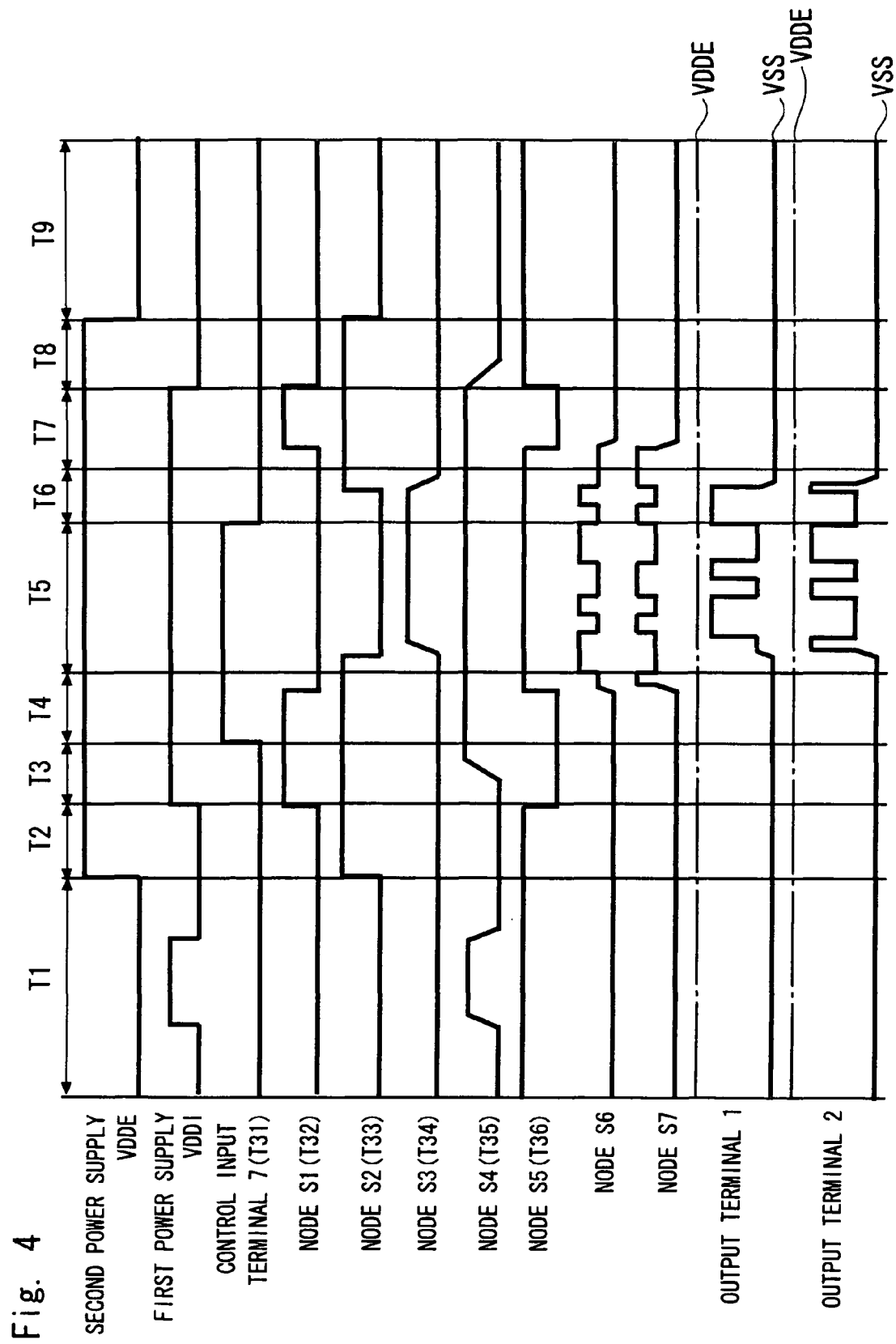
FIG. 4 is a timing chart for explaining an operation of a first exemplary embodiment.

FIG. 4 is a timing chart illustrating a circuit operation of the first exemplary embodiment. Note that the horizontal and vertical axes represent time and voltage respectively in FIG. 4, <Section T1>

The section T1 in FIG. 4 is explained. The second power supply VDDE is in an Off-state. The first power supply VDDI changes between On/Off states. The control input terminal 7 is in a power-down mode. In this case, since the second power supply VDDE, which is the high-voltage power supply, is in an Off-state, the low-withstand-voltage (high-speed) N-channel transistors NA1 and NA2 of the main-driver B2 are not destroyed.

<Section T2>

The section T2 in FIG. 4 is explained. The second power supply VDDE is in an On-state. The first power supply VDDI is in an Off-state. The control input terminal 7 is in a power-down mode.

In this case, since the first power supply VDDI is in an Off-state, the outputs of the low-withstand-voltage (high-speed) logic circuits G31 to G36 and the high-withstand-voltage (low-speed) logic circuit G37 of the overvoltage protection sequence circuit B3 are unsettled. Therefore, an unsettled signal is input to the gates of the high-withstand-voltage (low-speed) N-channel transistors NH32 and NH33. Next, the resistor R32 pulls down the node S38, and thereby lowers the gate voltage of the high-withstand-voltage (low-speed) P-channel transistor PH34 to the GND power supply VSS. As a result, the high-withstand-voltage (low-speed) P-channel transistor PH34 is turned on, and the voltage of the node S37 is thereby raised to the second power supply VDDE. Since the gate voltage of the high-withstand-voltage (low-speed) P-channel transistor PH35 is raised to the second power supply VDDE, the high-withstand-voltage (low-speed) P-channel transistor PH35 is turned off.

That is, the node S38, which is the output of the level shift circuit B7, outputs a L-level, and this L-level is input to the high-withstand-voltage (low-speed) logic circuit G38. The high-withstand-voltage (low-speed) logic circuit G38 outputs a H-level to the output terminal T33 of the overvoltage protection sequence circuit B3. As a result, a H-level is input to the gate of the high-withstand-voltage (low-speed) P-channel transistor PH51 of the switch B5 through the node S2 in FIG. 2, and the switch B5 is thereby turned off. Therefore, any voltage higher than the withstand voltage is not applied to the low-withstand-voltage (high-speed) N-channel transistors NA1 and NA2.

Figure 9:
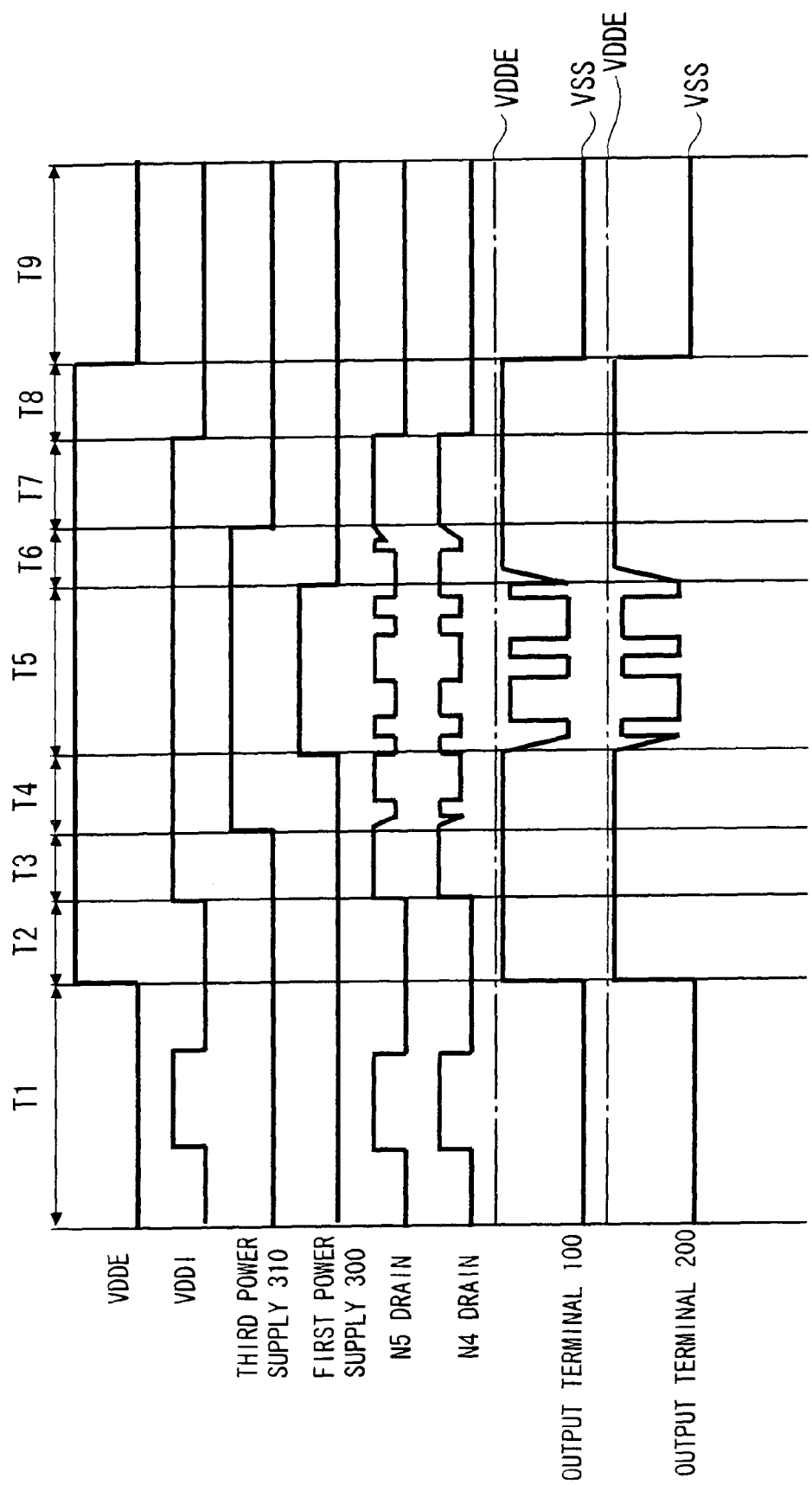
FIG. 9 is a timing chart of the conventional driver circuit of FIG. 8 under the assumption that the first and second N-channel MOS transistors N1 and N2 are constructed by using low-withstand-voltage (high-speed) N-channel transistors.

In the related art (FIGS. 8 and 9), when only the power supply VDDE of the output stage is turned on, there is a possibility that the transistors N1 and N2 could be destroyed. In contrast to this, in this exemplary embodiment of the present invention, when only the second power supply VDDE is turned on, the overvoltage protection sequence circuit B3 turns off the switch B5. That is, when the overvoltage protection sequence circuit B3 cannot obtain electrical power from the first power supply VDDI and therefore obtains the electrical power only from the second power supply, it can turn off the switch B5 by supplying an Off-signal (H-level in this example) to the switch B5. In this way, even if only the second power supply is turned on by mistake, the driver circuit can be still protected from being destroyed. Further, even if only the second power supply is turned on by mistake, no overvoltage is exerted on the main-driver B2. Therefore, it is possible to form the main-driver B2 by low-withstand-voltage (high-speed) transistors and thereby make the main-driver circuit B2 operate at a high speed with a large amplitude.

<Section T3>

The section T3 in FIG. 4 is explained. The second power supply VDDE and the first power supply VDDI are in an On-state. The control input terminal 7 is in a power-down mode. Firstly, a control path from the input terminal T31 of the overvoltage protection sequence circuit B3 to low-withstand-voltage (high-speed) logic circuits G33, G32 and G34 is explained.

In this case, since the main-driver B2 is in a suspended state, the resistor R8 pulls down the node S3 to the GND power supply VSS and the node S3 thereby becomes a L-level. This L-level propagates to the input terminal T34 of the overvoltage protection sequence circuit B3, and the node S33 thereby becomes a H-level. The node S33, which is the other input of the low-withstand-voltage (high-speed) logic circuit G32, is at a H-level, and a H-level, which is produced by the low-withstand-voltage (high-speed) logic circuit G33 by inverting the L-level of the control input terminal 7, is input to the node S32, which is the one input of the low-withstand-voltage (high-speed) logic circuit G32. Therefore, the output of the low-withstand-voltage (high-speed) logic circuit G32 is at a L-level, and the output terminal T36 of the overvoltage protection sequence circuit B3 thereby becomes a L-level.

Since the output terminal T36 of the overvoltage protection sequence circuit B3 outputs a L-level, a L-level is input to the gates of the low-withstand-voltage (high-speed) N-channel transistor N7 of the pre-driver B1 and the low-withstand-voltage (high-speed) N-channel transistor N11 of the main-driver B2 through the node S5. As a result, both the low-withstand-voltage (high-speed) N-channel transistor N7 of the pre-driver B1 and the low-withstand-voltage (high-speed) N-channel transistor N11 of the main-driver B2 are turned off. Therefore, the low-withstand-voltage (high-speed) N-channel transistor NA6, which serves as the constant current source, is not in the On-state any more. Similarly, the low-withstand-voltage (high-speed) N-channel transistor NA3, which serves as the constant current source of the main-driver B2, is not in the On-state any more.

Further, the low-withstand-voltage (high-speed) logic circuit G1 inputs a H-level, which is produced by inverting the L-level potential of the node S5, to the gates of the low-withstand-voltage (high-speed) N-channel transistors N9 and N10. As a result, the low-withstand-voltage (high-speed) N-channel transistors N9 and N10 are turned on. Therefore, the nodes S6 and S7 are clamped to the GND power supply VSS. Further, the output terminal T32 of the overvoltage protection sequence circuit B3 outputs a H-level, which is produced by the low-withstand-voltage (high-speed) logic circuit G34 by inverting the logic level of the output terminal T36 of the overvoltage protection sequence circuit B3. As a result, the H-level potential of the output terminal T32 of the overvoltage protection sequence circuit B3 is input to the gate of the low-withstand-voltage (high-speed) P-channel transistor P41 of the switch B4 through the node S1, and the low-withstand-voltage (high-speed) P-channel transistor P41 of the switch B4 is turned off. Therefore, the nodes S6 and S7, which are the output of the pre-driver B1, output L-levels. That is, the pre-driver B1 is stopped and enters a power-down state.

Next, a control path from the input terminal T31 of the overvoltage protection sequence circuit B3 to the low-withstand-voltage (high-speed) logic circuit G35, the level shift circuit B7, and the high-withstand-voltage (low-speed) logic circuit G38 is explained. In the early stages in which the first power supply VDDI is an On-state, since the potential of the node S4 of FIG. 2 is a L-level, the L-level is input to the input terminal T35 of the overvoltage protection sequence circuit B3. Since a L-level is input to the gate of the low-withstand-voltage (high-speed) N-channel transistor N31, the node S31 is at a H-level.

At this point, the node S34, which is the output of the low-withstand-voltage (high-speed) logic circuit G31, is at a L-level. Since a L-level is input to the node S34, which is the other input of the low-withstand-voltage (high-speed) logic circuit G35, the node S35, which is the output of the low-withstand-voltage (high-speed) logic circuit G35, is fixed at a L-level regardless of the level of the input terminal T31 of the overvoltage protection sequence circuit B3, which is the one input of the low-withstand-voltage (high-speed) logic circuit G35. As a result, the node S38, which is the output of the level shift circuit B7, becomes a L-level. Further, this L-level is inverted by the high-withstand-voltage (low-speed) logic circuit G38 and the output terminal T33 of the overvoltage protection sequence circuit B3 thereby becomes a H-level.

The H-level potential of the output terminal T33 of the overvoltage protection sequence circuit B3 is input to the gate of the high-withstand-voltage (low-speed) P-channel transistor PH51 of the switch B5 through the node S2, and the high-withstand-voltage (low-speed) P-channel transistor PH51 of the switch B5 is turned off.

Note that, with the operation explained above, the input of the control input terminal 7 is masked by the low-withstand-voltage (high-speed) logic circuit G35 of FIG. 3 until a bias circuit composed of the resistor R5 and the low-withstand-voltage (high-speed) N-channel transistor N12 of FIG. 2 starts to operate.

After a certain time has elapsed after the first power supply VDDI is turned on, the node S4 changes to a H-level and the H-level is input to the input terminal T35 of the overvoltage protection sequence circuit B3 of FIG. 3. As a result, since a H-level is input to the gate of the low-withstand-voltage (high-speed) N-channel transistor N31, the node S31 becomes a L-level. The node S34, which is the output of the low-withstand-voltage (high-speed) logic circuit G31 using the node S31 as the input, becomes a H-level. At this point, the other input of the low-withstand-voltage (high-speed) logic circuit G35 is at a L-level, that is, the L-level of the input terminal T31 of the overvoltage protection sequence circuit B3. Therefore, the low-withstand-voltage (high-speed) logic circuit G35 outputs a L-level to the node S35.

The node S38, which is the output of the level shift circuit B7, becomes a L-level. Further, this L-level is inverted by the high-withstand-voltage (low-speed) logic circuit G38 and the output terminal T33 of the overvoltage protection sequence circuit B3 thereby becomes a H-level. As a result, a H-level is input to the gate of the high-withstand-voltage (low-speed) P-channel transistor PH51 of the switch B5, and the switch B5 is thereby turned off. That is, the main-driver B2 is stopped and enters a power-down state.

Even if the second power supply VDDE and the first power supply VDDI are both in an On-state, the switch B4 and the switch B5 are maintained in the Off-state by the overvoltage protection sequence circuit B3 when the control input terminal 7 is in a power-down mode. Therefore, both of the pre-driver B1, and the main-driver B2 are stopped and enter a power-down state.

In the related art (FIGS. 8 and 9), if the power supplies VDDI and VDDE are in an On-state while the transistors N3 and N6, which serve as the current source in the level shift circuit and the output stage, remain in the Off-state, an overvoltage is exerted on the output stage and thus posing a possibility that the transistors could be destroyed. In contrast to this, in this exemplary embodiment of the present invention, even if the power supplies VDDI and VDDE are both in an On-state, the switch B4 and the switch B5 are maintained in the Off-state by the overvoltage protection sequence circuit B3 when the control input terminal 7 is in a power-down mode. Therefore, even if the power supplies VDDI and VDDE are turned on by mistake, no overvoltage is exerted on the main-driver circuit B2. Therefore, the main-driver B2 is protected from being destroyed. Further, it is possible to form the main-driver B2 by low-withstand-voltage (high-speed) transistors and thereby make the main-driver B2 operate at a high speed with a large amplitude.

<Section T4>

The section T4 in FIG. 4 is explained. The second power supply VDDE and the first power supply VDDI are in an On-state, and the control input terminal 7 is in an enable mode. Firstly, a control path from the input terminal T31 of the overvoltage protection sequence circuit to low-withstand-voltage (high-speed) logic circuits G33, G32 and G34 is explained. Since the main-driver B2 is in a suspended state, the resistor R8 pulls down the node S3 to the GND power supply VSS and the node S3 thereby becomes a L-level. As a result, this L-level propagates to the input terminal T34 of the overvoltage protection sequence circuit B3 of FIG. 3. By the inversion carried out by the low-speed (high-withstand-voltage) logic circuit G37, the node S33 becomes a H-level. The node S33, which is the other input of the low-withstand-voltage (high-speed) logic circuit G32, is at a H-level. Further, the node S32, which is the one input of the low-withstand-voltage (high-speed) logic circuit G32, is at a L-level, which is produced by the low-withstand-voltage (high-speed) logic circuit G33 by inverting the H-level of the control input terminal 7. Therefore, the output of the low-withstand-voltage (high-speed) logic circuit G32 becomes a H-level.

The output terminal T36 of the overvoltage protection sequence circuit B3 outputs a H-level, and the H-level is input to the gate of the low-withstand-voltage (high-speed) N-channel transistor N7 of the pre-driver B1 of FIG. 2 through the node S5. As a result, the low-withstand-voltage (high-speed) N-channel transistor N7 is turned on. Therefore, the low-withstand-voltage (high-speed) N-channel transistor NA6, which serves as the constant current source, is turned on. Similarly, the low-withstand-voltage (high-speed) N-channel transistor NA3, which serves as the constant current source of the main-driver B2, is turned on. Further, since the H-level of the node S5 is inverted by the low-withstand-voltage (high-speed) logic circuit G1 and the resultant L-level is input to the gates of the low-withstand-voltage (high-speed) N-channel transistors N9 and N10, the low-withstand-voltage (high-speed) N-channel transistors N9 and N10 are turned off. Therefore, the nodes S6 and S7 are disengaged from the clamped state at the GND power supply VSS.

The output terminal T32 of the overvoltage protection sequence circuit B3 of FIG. 3 outputs a L-level, which is produced by the low-withstand-voltage (high-speed) logic circuit G34 by inverting the logic level of the output terminal T36 of the overvoltage protection sequence circuit B3. As a result, a L-level is input to the gate of the low-withstand-voltage (high-speed) P-channel transistor P41 of the switch B4 of FIG. 2, and the switch B4 is thereby turned on.

At this point, the nodes S6 and S7, which are the output of the pre-driver B1, output complementary differential signals. That is, the pre-driver B1 starts to operate and changes to an enable state.

In the sections described above, the low-withstand-voltage (high-speed) N-channel transistors NA1 and NA2, which serve as the differential inputs of the pre-driver B1 and the main-driver B2, and the low-withstand-voltage (high-speed) N-channel transistors NA3 and NA6, which serve as the constant current source, operate.

<Section T5>

The section T5 in FIG. 4 is explained. The second power supply VDDE and the first power supply VDDI are in an On-state, and the control input terminal 7 is in an enable mode. A control path from the input terminal T31 of the overvoltage protection sequence circuit B3 to the low-withstand-voltage (high-speed) logic circuit G35, the level shift circuit B7, and the low-withstand-voltage (high-speed) logic circuit G38 of FIG. 3 is explained. Since the node S34, which is the other input of the low-withstand-voltage (high-speed) logic circuit G35 of FIG. 3, is already at a H-level, the H-level of the input terminal T31 of the overvoltage protection sequence circuit B3, which is the one input of the low-withstand-voltage (high-speed) logic circuit G35, propagates to the node S35.

As a result, the node S38, which is the output of the level shift circuit B7 of FIG. 3, becomes a H-level. Further, this H-level is inverted by the high-withstand-voltage (low-speed) logic circuit G38 and the output terminal T33 of the overvoltage protection sequence circuit B3 thereby becomes a L-level. The L-level of the output terminal T33 propagates to the node S2. The L-level potential of the node S2 is input to the gate of the high-withstand-voltage (low-speed) P-channel transistor PH51 of the switch B5 of FIG. 2, and the switch B5 is thereby turned on.

Note that the path from the input terminal T31 of the overvoltage protection sequence circuit B3 to the output terminal T32 of the overvoltage protection sequence circuit B3 controls the switch B4. Further, the path from the input terminal T31 of the overvoltage protection sequence circuit B3 to the output terminal T33 of the overvoltage protection sequence circuit B3 controls the switch B5. With regard to the delay time of the paths to control the switches B4 and B5, the path from the input terminal T31 of the overvoltage protection sequence circuit B3 to the output terminal T33 of the overvoltage protection sequence circuit B3 has a larger delay time because it includes the level shift circuit B7 including the high-withstand-voltage (low-speed) N-channel transistors NH32 and NH33 and the high-withstand-voltage (low-speed) P-channel transistors PH34 and PH35, and the high-withstand-voltage (low-speed) logic circuit G38. That is, the switch B4 is always turned on first, and then the switch B5 is turned on after that. In this way, the pre-driver B1 starts to operate and enters an enable state first, and then the main-driver B2 starts the action after that.

In accordance with the first exemplary embodiment, when the control input terminal 7 is set to the enable mode, the switch B5 is turned on after the turning-on of the switch B4. That is, the supply of the second power supply starts after a signal, which is level-shifted by the pre-driver B1, is applied to the gate of the transistors NA1 and NA2 of the main-driver B2. Therefore, the voltage between the gate and source of the transistors NA1 and NA2 of the main-driver B2 does not rise excessively, and therefore the destruction of the transistors NA1 and NA2 is prevented. In this way, it is possible to form the main-driver B2 by low-withstand-voltage (high-speed) transistors and thereby make the main-driver B2 operate at a high speed with a large amplitude.

Note that the center voltage of the complementary differential signals from the output terminals 1 and 2 during the section in which signals are output is determined by the following formula.

{second power supply VDDE−(resistor R3 or R4×half of the drain current of low-withstand-voltage (high-speed) transistor NA3)}

Further, since the H-level voltage from the output terminals 1 and 2 is connected to a terminator B6 on the receiving side, it does not rise to the second power supply VDDE.

So far, operations performed when the control input terminal 7 is changed from a power-down mode to an enable mode in a situation where the power supply is to be changed from an Off-state to an On-state are explained. Next, a case where the control input terminal 7 is changed from an enable mode to a power-down mode and the power supply is changed from an On-state to an Off-state is explained.

<Section T6>

The section T6 in FIG. 4 is explained. The second power supply VDDE and the first power supply VDDI are in an On-state, and the control input terminal 7 is in a power-down mode. A control path from the input terminal T31 of the overvoltage protection sequence circuit B3 to low-withstand-voltage (high-speed) logic circuits G33, G32 and G34 is explained. Since the main-driver B2 is continuously operating, the node S3 is at a H-level. This H-level propagates to the input terminal T34 of the overvoltage protection sequence circuit B3, and the node S33 becomes a L-level through the inversion of the signal performed by the high-withstand-voltage (low-speed) logic circuit G37. Since the node S33, which is the other input of the low-withstand-voltage (high-speed) logic circuit G32, becomes a L-level, the output terminal T36 of the overvoltage protection sequence circuit B3 is fixed to a H-level regardless of the level of the node S32, which is the one input of the low-withstand-voltage (high-speed) logic circuit G32.

In this way, in the section in which the main-driver B2 is continuously operating, the input from the control input terminal 7 is masked by the low-withstand-voltage (high-speed) logic circuit G32. Therefore, the switch B4 and the low-withstand-voltage (high-speed) N-channel transistors NA3 and NA6, which are the constant current sources, are maintained in the On-state. Further, the pre-driver B1 continues to output the complementary differential signals to the nodes S6 and S7. Therefore, the low-withstand-voltage (high-speed) N-channel transistors NA1 and NA2 become mutually different states between On/Off states, and the pre-driver B1 and the main-driver B2 remain in the enable state.

A control path from the input terminal T31 of the overvoltage protection sequence circuit B3 to the low-withstand-voltage (high-speed) logic circuit G35, the level shift circuit B7, and the low-withstand-voltage (high-speed) logic circuit G38 is explained. The first power supply VDDI is in an On-state and the node S4 is at a H-level. Therefore, a H-level is input to the input terminal T35 of the overvoltage protection sequence circuit B3. A H-level is input to the gate of the low-withstand-voltage (high-speed) N-channel transistor N31, and the node S31 thereby becomes a L-level. The L-level of the node S31 is inverted by the low-withstand-voltage (high-speed) logic circuit G31, and the node S34 thereby becomes a H-level.

Since the H-level of the node S34 and the L-level of the input terminal T31 of the overvoltage protection sequence circuit B3 are input to the low-withstand-voltage (high-speed) logic circuit G35, the node S35, which is the output of the low-withstand-voltage (high-speed) logic circuit G35, becomes a L-level. As a result, the node S38, which is the output of the level shift circuit B7, becomes a L-level. Then, this L-level is inverted by the high-withstand-voltage (low-speed) logic circuit G38 and the output terminal T33 of the overvoltage protection sequence circuit B3 thereby becomes a H-level. In this way, a H-level is input to the gate of the high-withstand-voltage (low-speed) P-channel transistor PH51 of the switch B5, and the switch B5 is thereby turned off.

Therefore, the main-driver B2 stops its operation, and the level of the node S3 falls from the H-level to a L-level. That is, the main-driver B2 stops and enters a power-down state before the pre-driver B1.

As has been described so far, in this first exemplary embodiment of the present invention, even in a case where the control input terminal 7 is changed to a power-down mode, if the voltage monitoring signal (S3) from the main-driver B2 is at a H-level, the switch B4 is maintained in the On-state while the switch B5 is turned off earlier than the switch B4 in response to the change to the power-down mode. In this way, even in the power-down mode in which the operation is suspended without shutting down the power supply, no overvoltage is exerted on the transistors of the main-driver B2 and the main-driver B2 is thereby protected from being destroyed. Further, it is possible to form the main-driver B2 by low-withstand-voltage (high-speed) transistors and thereby make the main-driver B2 operate at a high speed with a large amplitude.

<Section T7>

The section T7 in FIG. 4 is explained. The second power supply VDDE and the first power supply VDDI are in an On-state, and the control input terminal 7 is in a power-down mode. A control path from the input terminal T31 of the overvoltage protection sequence circuit B3 to low-withstand-voltage (high-speed) logic circuits G33, G32 and G34 is explained. Since the main-driver B2 is in a suspended state, the resistor R8 pulls down the node S3 to the GND power supply VSS and the node S3 thereby becomes a L-level. This L-level propagates to the input terminal T34 of the overvoltage protection sequence circuit B3, and the node S33 becomes a H-level through the inversion of the signal performed by the high-withstand-voltage (low-speed) logic circuit G37.

Since the H-level of the node S33 and the H-level produced by the low-withstand-voltage (high-speed) logic circuit G33 by inverting the L-level of the control input terminal 7 are input to the low-withstand-voltage (high-speed) logic circuit G32, the output of the low-withstand-voltage (high-speed) logic circuit G32 becomes a L-level. The output terminal T36 of the overvoltage protection sequence circuit B3 outputs a L-level, and the L-level is input to the gate of the low-withstand-voltage (high-speed) N-channel transistor N7 of the pre-driver B1. As a result, the low-withstand-voltage (high-speed) N-channel transistor N7 of the pre-driver B1 is turned off. Therefore, the low-withstand-voltage (high-speed) N-channel transistor NA6, which is the constant current source, is not in the On-state any more.

Similarly, the low-withstand-voltage (high-speed) N-channel transistor NA3, which is the constant current source of the main-driver B2, is not in the On-state any more. Further, since a H-level, which is produced by the low-withstand-voltage (high-speed) logic circuit G1 by inverting the L-level of the node S5, is input to the gates of the low-withstand-voltage (high-speed) N-channel transistors N9 and N10, the low-withstand-voltage (high-speed) N-channel transistors N9 and N10 are turned on. Therefore, the nodes S6 and S7 are clamped to the GND power supply VSS.

Since the L-level of the output terminal T36 of the overvoltage protection sequence circuit B3 is inverted by the low-withstand-voltage (high-speed) logic circuit G34, the output terminal T32 of the overvoltage protection sequence circuit B3 outputs a H-level. A H-level is input to the gate of the low-withstand-voltage (high-speed) P-channel transistor P41 of the switch B4, and the switch B4 is thereby turned off.

As a result, the nodes S6 and S7, which are the output of the pre-driver B1, output L-levels. That is, the pre-driver B1 is suspended and enters a power-down state after the main-driver B2.

<Section T8>

In the section T8 of FIG. 4, the second power supply VDDE is an On-state; the first power supply VDDI is in an Off-state; and the control input terminal 7 is in a power-down mode. The operation in this section is similar to that of the section T2, and therefore its explanation is omitted.

<Section T9>

The section T9 in FIG. 4 is explained. The second power supply VDDE and the first power supply VDDI are in an Off-state, and the control input terminal 7 is in a power-down mode. Since all the power supplies are in an Off-state, the low-withstand-voltage (high-speed) N-channel transistors NA1 and NA2 are not destroyed.

So far, operations of the first exemplary embodiment of the present invention, in which any voltage higher than the overvoltage is not applied to the low-withstand-voltage (high-speed) N-channel transistors NA1 and NA2 in any of the sections T1 to T9, and which can thereby implement the control so that the gate oxide film is not destroyed and operate at a high speed with a large amplitude, have been explained. That is, the main-driver B2 is protected from an overvoltage by the above-explained control operation of the overvoltage protection sequence circuit B3 in any combination states of the On/Off states of the power supplies VDDI and VDDE and the enable mode/power-down modes of the control input terminal 7. Therefore, it becomes possible to set the second power supply VDDE to a higher voltage and to form the main-driver B2 by low-withstand-voltage (high-speed) transistors. Further, it is also possible to make the main-driver B2 operate at a high speed with a large amplitude.

Note that the specific circuit configuration of the overvoltage protection sequence circuit B3 is not limited to the above-described examples, provided that the above-described control can be implemented by the adopted configuration. That is, the overvoltage protection sequence circuit B3 can take on various configurations.

Second Exemplary Embodiment

Figure 5:
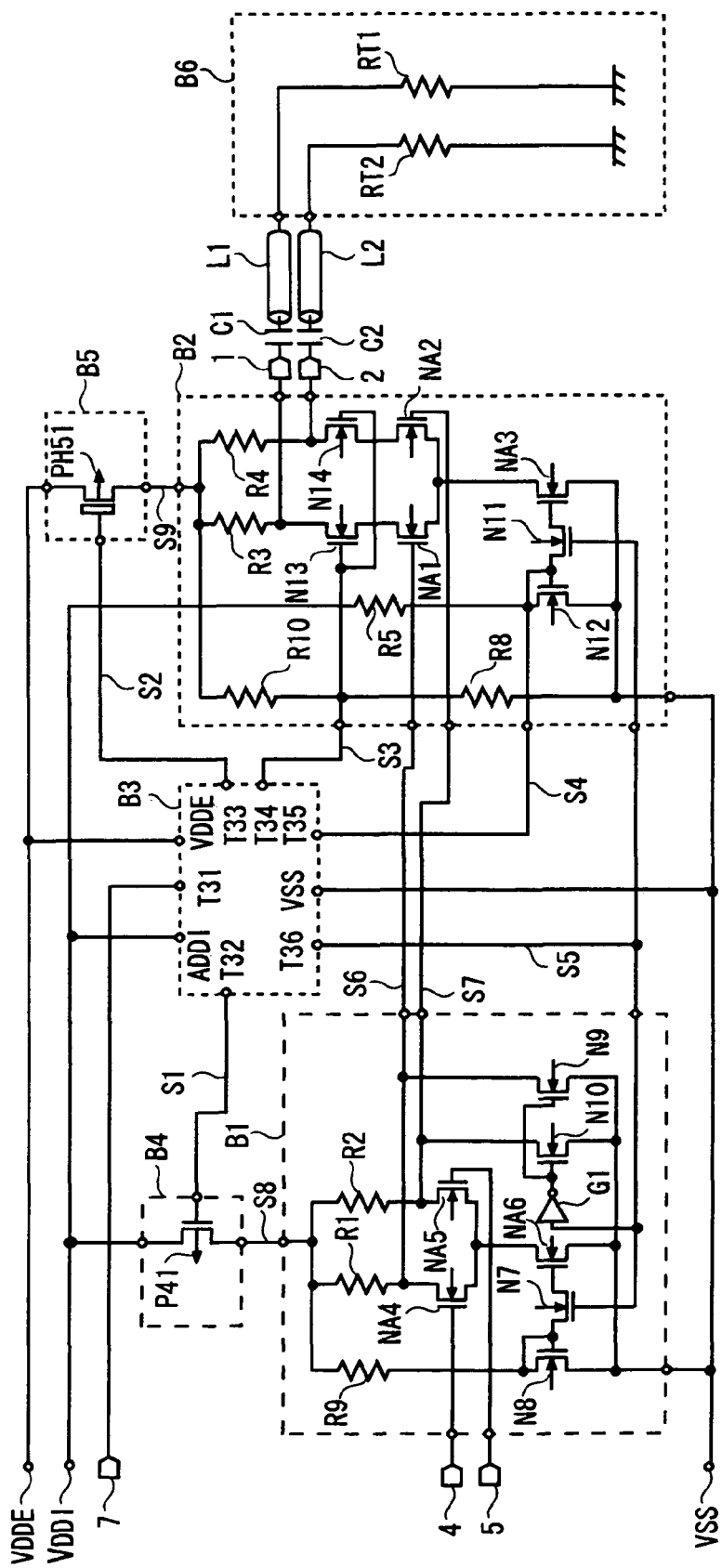
FIG. 5 is a circuit diagram showing a configuration of a driver circuit in accordance with a second exemplary embodiment of the present invention.

A second exemplary embodiment of the present invention is explained. FIG. 5 is a circuit diagram showing a configuration of a driver circuit in accordance with a second exemplary embodiment. With regard to the configuration of the main-driver B2 of the second exemplary embodiment, the differences from the first exemplary embodiment shown in FIG. 2 are explained.

In FIG. 5, a main-driver B2 includes a resistor R10 and low-withstand-voltage (high-speed) N-channel transistors N13 and N14 in place of the resistors R6 and R7 of the first exemplary embodiment. One terminal of the resistor R10 is connected to the node S9, which is the output of the switch B5, and the other terminal is connected to one terminal of the resistor R8 and the node S3. The other terminal of the resistor R3 is connected to the drain of the low-withstand-voltage (high-speed) N-channel transistor N13 and to the output terminal 1. The source of the low-withstand-voltage (high-speed) N-channel transistor N13 is connected to the drain of the low-withstand-voltage (high-speed) N-channel transistor NA1.

The other terminal of the resistor R4 is connected to the drain of the low-withstand-voltage (high-speed) N-channel transistor N14 and to the output terminal 2. The source of the low-withstand-voltage (high-speed) N-channel transistor N14 is connected to the drain of the low-withstand-voltage (high-speed) N-channel transistor NA2. The gates of the low-withstand-voltage (high-speed) N-channel transistors N13 and N14 are both connected to the node S3, which is the other terminal of the resistor R10.

In the second exemplary embodiment like this, the operations are similar to those of the first exemplary embodiment. In the configuration like this, the main-driver B2 is a cascode type. In this way, it is possible to increase the second power supply VDDE to a higher voltage even further, and thereby to cope with an operation with a larger amplitude.

Third Exemplary Embodiment

Figure 6:
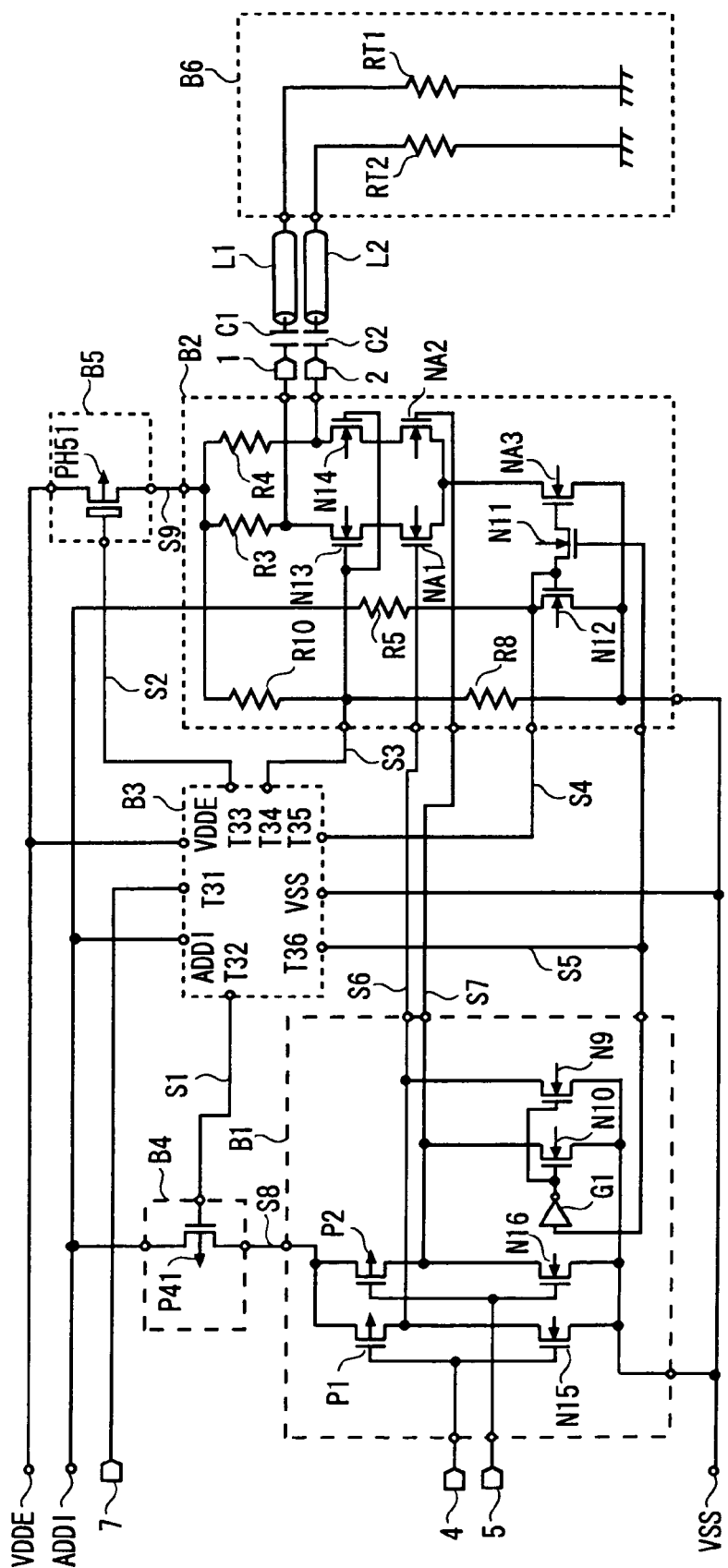
FIG. 6 is a circuit diagram showing a configuration of a driver circuit in accordance with a third exemplary embodiment of the present invention.

A third exemplary embodiment of the present invention is explained. FIG. 6 is a circuit diagram showing a configuration of a driver circuit in accordance with a third exemplary embodiment. The configuration of the main-driver B2 is the same as that explained in the second exemplary embodiment. With regard to the configuration of the pre-driver B1 of the third exemplary embodiment, the differences from the first exemplary embodiment shown in FIG. 2 are explained.

In FIG. 6, a pre-driver B1 includes low-withstand-voltage (high-speed) P-channel transistors P1 and P2 and low-withstand-voltage (high-speed) N-channel transistors N15 and N16 in place of the resistors R1, R2 and R9 and the low-withstand-voltage (high-speed) N-channel transistors NA4 to NA6, N7 and N8. The gates of the low-withstand-voltage (high-speed) P-channel transistor P1 and the low-withstand-voltage (high-speed) N-channel transistor N15 are connected to the input terminal 4, and their drains are connected to the node S6. The gates of the low-withstand-voltage (high-speed) P-channel transistor P2 and the low-withstand-voltage (high-speed) N-channel transistor N16 are connected to the input terminal 5, and their drains are connected to the node S7. The sources of the low-withstand-voltage (high-speed) P-channels transistor P1 and P2 are connected to the node S8, which is the output of the switch B4. Further, the sources of the low-withstand-voltage (high-speed) N-channel transistors N15 and N16 are connected to the GND power supply VSS.

In the third exemplary embodiment like this, the operations are similar to those of the first exemplary embodiment. In the configuration like this, the pre-driver B1 is a CMOS type. In this way, a configuration capable of consuming lower electrical power can be realized.

Note that the pre-driver B1 is not limited to the differential circuit configurations.

Fourth Exemplary Embodiment

Figure 7:
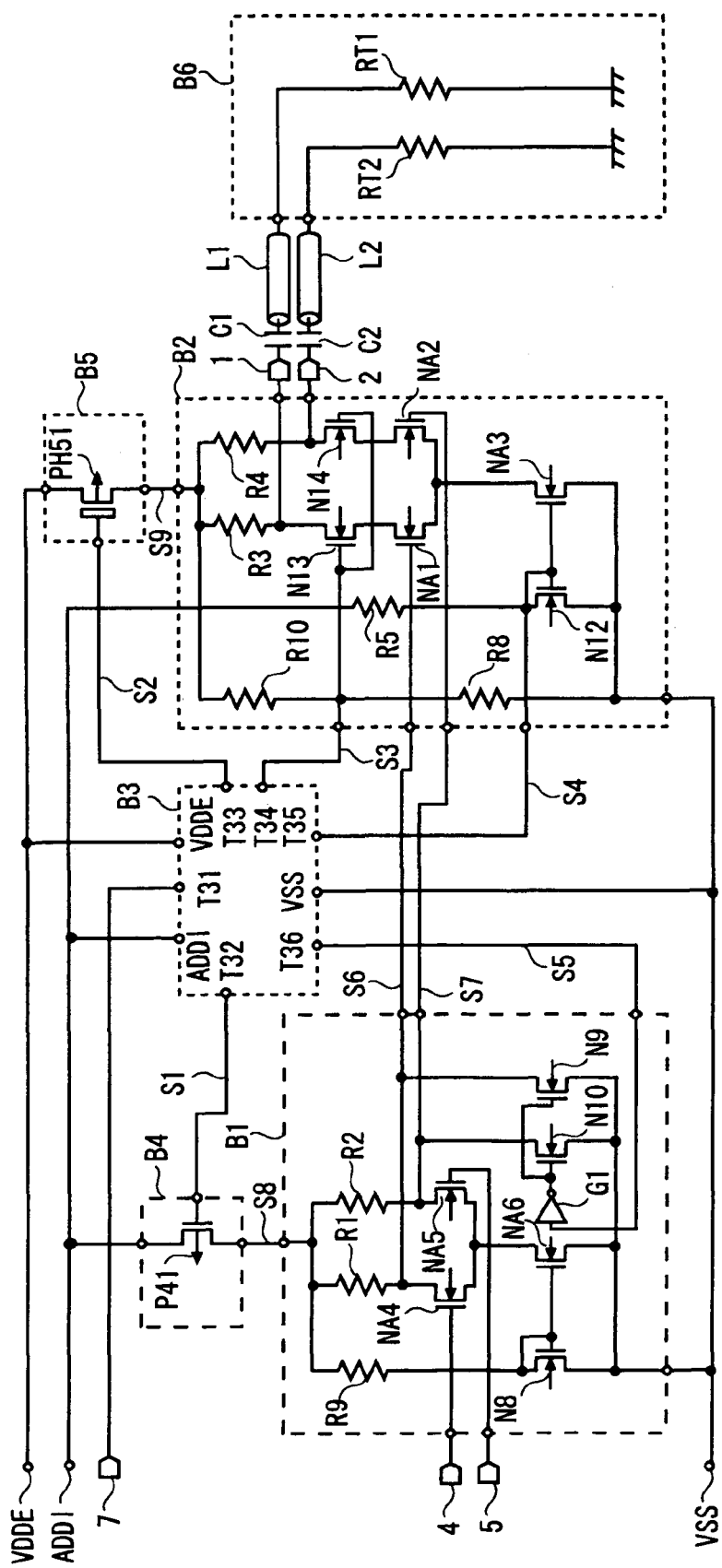
FIG. 7 is a circuit diagram showing a configuration of a driver circuit in accordance with a fourth exemplary embodiment of the present invention.

A fourth exemplary embodiment of the present invention is explained. FIG. 7 is a circuit diagram showing a configuration of a driver circuit in accordance with a fourth exemplary embodiment. With regard to the configuration of the main-driver B2 and the pre-driver B1, the differences from the first exemplary embodiment shown in FIG. 2 are explained.

In FIG. 7, the pre-driver B1 does not include the low-withstand-voltage (high-speed) N-channel transistor N7, and is equivalent to such a configuration that the drain and source of the low-withstand-voltage (high-speed) N-channel transistor N7 are short-circuited.

The main-driver B2 includes a resistor R10 and low-withstand-voltage (high-speed) N-channel transistors N13 and N14 in place of the resistors R6 and R7. One terminal of the resistor R10 is connected to the node S9, which is the output of the switch B5, and the other terminal is connected to one terminal of the resistor R8 and the node S3. The other terminal of the resistor R3 is connected to the drain of the low-withstand-voltage (high-speed) N-channel transistor N13 and to the output terminal 1. The source of the low-withstand-voltage (high-speed) N-channel transistor N13 is connected to the drain of the low-withstand-voltage (high-speed) N-channel transistor NA1.

The other terminal of the resistor R4 is connected to the drain of the low-withstand-voltage (high-speed) N-channel transistor N14 and to the output terminal 2. The source of the low-withstand-voltage (high-speed) N-channel transistor N14 is connected to the drain of the low-withstand-voltage (high-speed) N-channel transistor NA2. The gates of the low-withstand-voltage (high-speed) N-channel transistors N13 and N14 are both connected to the node S3, which is the other terminal of the resistor R10.

The low-withstand-voltage (high-speed) N-channel transistor N11 in the first exemplary embodiment is eliminated in the fourth exemplary embodiment. That is, it is equivalent to such a configuration that the drain and source of the low-withstand-voltage (high-speed) N-channel transistor N11 are short-circuited.

In the fourth exemplary embodiment like this, the operations are similar to those of the first exemplary embodiment. In the configuration like this, the number of components necessary to form the pre-driver B1 and the main-driver B2 can be reduced in comparison to the first exemplary embodiment because the low-withstand-voltage (high-speed) N-channel transistors N7 and N11 are eliminated.

Note that the low-withstand-voltage (high-speed) N-channel transistors NA3 and NA6, which are the constant current sources, can be constantly put in an On-state.

Note that the present invention is not limited to above-described exemplary embodiments, and various modifications can be made without departing from the scope and spirit of the present invention.

While the invention has been described in terms of several exemplary embodiments, those skilled in the art will recognize that the invention can be practiced with various modifications within the spirit and scope of the appended claims and the invention is not limited to the examples described above.

The exemplary embodiments mentioned above can be combined as desirable by one of ordinary skill in the art.

Further, the scope of the claims is not limited by the exemplary embodiments described above.

Furthermore, it is noted that, Applicant's intent is to encompass equivalents of all claim elements, even if amended later during prosecution.

What is claimed is:

1. A driver circuit comprising:
a pre-driver that operates by receiving operating power from a first power supply;
a main-driver that receives operating power from a second power supply, and amplifies an output signal from the pre-driver and outputs the amplified signal;
a first switch provided between the first power supply and the pre-driver;
a second switch provided between the second power supply and the main-driver; and an overvoltage protection sequence circuit that receives operating power from the first and second power supplies and performs On/Off control of the first and second switch.

2. The driver circuit according to claim 1, wherein when the first power supply is an Off-state and only the second power supply is an On-state, the overvoltage protection sequence circuit disconnects the main-driver from the second power supply by turning off the second switch.

3. The driver circuit according to claim 1, wherein
a mode switching signal used to perform switching between an enable mode and a power-down mode is input to the overvoltage protection sequence circuit from an external control terminal, and
when the mode switching signal is in a power-down mode, the overvoltage protection sequence circuit maintains the second switch in an Off-state.

4. The driver circuit according to claim 1, wherein
a voltage monitoring signal used to monitor an operating voltage of the main-driver is input to the overvoltage protection sequence circuit, and a mode switching signal used to perform switching between an enable mode and a power-down mode is also input to the overvoltage protection sequence circuit from an external control terminal, and
the overvoltage protection sequence circuit disconnects the pre-driver from the first power supply by turning off the first switch in response to a situation in which the voltage monitoring signal of the main-driver is at a low level and the mode switching signal is in a power-down mode.

5. The driver circuit according to claim 1, wherein
a mode switching signal used to perform switching between an enable mode and a power-down mode is input to the overvoltage protection sequence circuit from an external control terminal, and
the overvoltage protection sequence circuit turns on the first switch in response to a situation in which the mode switching signal is in an enable mode.

6. The driver circuit according to claim 1, wherein
a mode switching signal used to perform switching between an enable mode and a power-down mode is input to the overvoltage protection sequence circuit from an external control terminal, and
the overvoltage protection sequence circuit turns on a constant current source of the pre-driver and the main-driver and disengages clamping, with which an output line of the pre-driver is grounded, in response to a situation in which the mode switching signal is in an enable mode.

7. The driver circuit according to claim 1, wherein
a mode switching signal used to perform switching between an enable mode and a power-down mode is input to the overvoltage protection sequence circuit from an external control terminal, and
the overvoltage protection sequence circuit turns on the second switch when the first power supply is an On-state and the mode switching signal is in an enable mode.

8. The driver circuit according to claim 1, wherein the overvoltage protection sequence circuit turns on the first switch first, and then turns on the second switch.

9. The driver circuit according to claim 1, wherein
even if the mode switching signal is changed from an enable mode to a power-down mode, the overvoltage protection sequence circuit maintains the first switch in an On-state when the voltage monitor signal from the main-driver is at a H-level, and
the overvoltage protection sequence circuit turns off the second switch first, and then turns off the first switch.

10. The driver circuit according to claim 1, wherein the second power supply supplies a higher voltage than the first power supply.

11. The driver circuit according to claim 1, wherein an output portion of the main-driver is formed by low-withstand-voltage transistors.

* * * * *